United States Patent
Yallup

[19]

[11] Patent Number: 5,877,065

[45] Date of Patent: *Mar. 2, 1999

[54] PROCESS FOR FABRICATING INSULATION-FILLED DEEP TRENCHES IN SEMICONDUCTOR SUBSTRATES

[75] Inventor: Kevin Yallup, Limerick, Ireland

[73] Assignee: Analog Devices Incorporated, Norwood, Mass.

[*] Notice: This patent issued on a continued prosecution application filed under 37 CFR 1.53(d), and is subject to the twenty year patent term provisions of 35 U.S.C. 154(a)(2).

[21] Appl. No.: 424,953

[22] Filed: Apr. 19, 1995

Related U.S. Application Data

[63] Continuation of Ser. No. 249,288, May 26, 1994, abandoned, which is a continuation of Ser. No. 792,441, Nov. 15, 1991, abandoned.

[51] Int. Cl.$^6$ .................................................. H01L 21/76
[52] U.S. Cl. ........................................ 438/404; 438/432
[58] Field of Search ............... 437/62, 72; 148/DIG. 85, 148/DIG. 86, DIG. 117; 438/404, 431, 432

[56] References Cited

U.S. PATENT DOCUMENTS

| | | |
|---|---|---|
| 4,477,310 | 10/1984 | Park et al. . |
| 4,853,344 | 8/1989 | Darmawan . |
| 4,876,214 | 10/1989 | Yamaguchi et al. . |
| 4,923,826 | 5/1990 | Satrzebski et al. . |
| 5,336,634 | 8/1994 | Katayama et al. . |
| 5,352,625 | 10/1994 | Hoshi . |
| 5,356,822 | 10/1994 | Lin et al. . |
| 5,416,041 | 5/1995 | Schwalke . |
| 5,470,782 | 11/1995 | Schwalke et al. . |
| 5,480,832 | 1/1996 | Miura et al. ................... 437/62 |

FOREIGN PATENT DOCUMENTS

| | | |
|---|---|---|
| 61-139043 | 6/1986 | Japan . |
| 61-154144 | 7/1986 | Japan . |
| 62-254444 | 11/1987 | Japan . |

Primary Examiner—George Fourson
Attorney, Agent, or Firm—Parmelee & Bollinger LLP

[57] ABSTRACT

A method for forming an isolation wall in a silicon semiconductor substrate wherein a trench is etched into the silicon using a hard mask, a layer of silicon dioxide is formed on the side walls of the trench, a filling of polysilicon is placed in the region between the side wall layers, the polysilicon is planarized by etching while the hard mask remains in place, and the hard mask then is stripped from the silicon, permitting field oxide to be grown over the trench region.

2 Claims, 2 Drawing Sheets

5,877,065

PROCESS FOR FABRICATING INSULATION-FILLED DEEP TRENCHES IN SEMICONDUCTOR SUBSTRATES

This application is a continuation of application Ser. No. 08/249,288 filed May 26, 1994 which is a continuation of application Ser. No. 07/792,441 as originally filed on Nov. 15, 1991, both now abandoned.

BACKGROUND OF THE INVENTION

1. Field of the Invention

This invention relates to processes for developing isolation walls in semiconductor devices such as integrated circuit (IC) chips. More particularly, this invention is related to so-called trench isolation, wherein a trench is formed in the semiconductor device and filled with an insulating material.

2. Description of the Prior Art

It frequently is necessary to electrically isolate adjacent portions of an integrated circuit, and various techniques have been developed for this purpose. One such technique that has practical advantages is that of forming a trench at the place where isolation is needed, and filling the trench with an insulating material. Although a variety of proposals have been put forward for such purpose, important problems have arisen with all of those proposals.

For example, when a field oxide is thermally grown over a trench isolation region, a large step can (with prior art techniques) develop in the field oxide just above the trench edge, due to the usual difference in height between the insulation surface and the surrounding silicon, and the commonly lower oxidation rate of the insulating material as compared to the surrounding bulk material. Another problem is that notches can develop in the field oxide if the trench filling is layered in such a way that differential etching occurs at one or more layers. Such notches can attract residues from subsequent layers deposited over the trench (to form portions of the integrated circuit) such that conductive lines crossing the trench become electrically interconnected, thereby resulting in a defective part. Also, when using trench isolation with a Silicon On Insulation (SOI) substrate, the removal of the trench hard mask after trench etch can lead to unintended etching of the buried insulating layer which can cause defective parts.

Efforts have been made by others to solve some of these and still further problems. For example, it has been proposed to use a combination of additional oxide steps and a nitride/oxide sandwich layer, as described in U.S. Pat. No. 4,791,073. Such a procedure however is excessively complex. Moreover, the additional thermal steps can adversely affect the characteristics of the final product, and such procedure would not in any event solve the problem of etching of the buried oxide layer of a Silicon-On-Insulation substrate.

SUMMARY OF THE INVENTION

In a preferred embodiment of the invention, to be described in detail hereinafter, a process is employed wherein a sacrificial layer is maintained in place during the basic formative steps so as to provide important protections from adverse effects, and then is removed just prior to completion of the trench isolation portions of the process. This sacrificial layer in the preferred embodiment is the hard mask used to establish the etch opening for forming the trench. This hard mask is not, as is conventional, stripped after trench etch, but is retained in place to provide protection as will be apparent from the following description. At the end of the process, after planarization of the trench filling dielectric, the hard mask is stripped away, and the substrate is in condition to have field oxide thermally grown over the trench without the problems previously encountered.

Other objects, aspects and advantages of the invention will in part be pointed out in, and in part apparent from, the following detailed description of a preferred embodiment of the invention, considered together with the accompanying drawings.

DETAILED DESCRIPTION OF A PREFERRED EMBODIMENT

Figure 1:
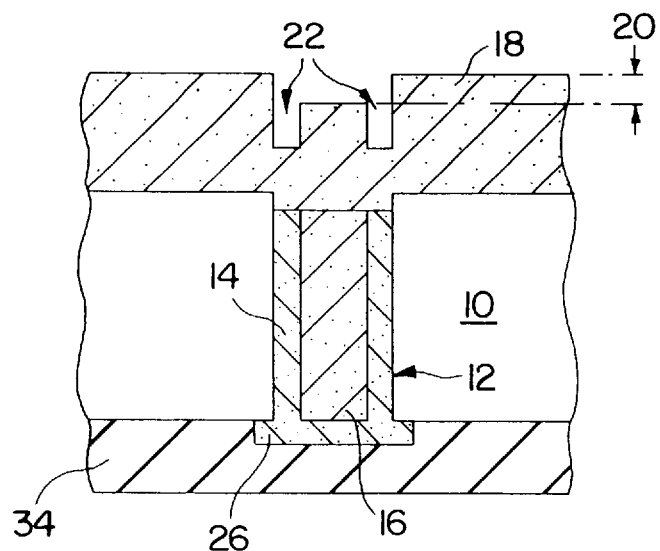
FIG. 1 is a sectional view of a semiconductive substrate with a buried insulator and showing the kinds of adverse characteristics that can develop when following conventional practices.

FIG. 1 has been included to illustrate the nature of some of the problems which can occur by following conventional processing techniques. This figure shows in cross-section a substrate 10 of the Silicon-On-Insulator (SOI) type after it has been processed to form a trench 12 having insulative layers 14 (such as silicon dioxide) side walls of the trench and an insulative filling 16 (such as polysilicon) in the central region between the side wall layers 14. It particularly will be seen that the thermally-grown field oxide 18 is formed with a large step 20 at the trench edge due to the difference in height between the upper surface of the insulative filling 16 and the surrounding surface of the silicon, and also due to the (usual) lower oxidation rate of the central filling 16 as compared to the surrounding bulk material.

Notches 22 also can develop at the trench edges due to differential etching of the relatively thin layers forming part of the trench fill. Such notches can retain residues from subsequent layers that are deposited over the trench and patterned and removed to form portions of the integrated circuit. Such residues can cause inter-connections between conductive lines formed in such subsequent layers and crossing the trench region. Such inter-connections would of course almost certainly result in defective parts.

If the hard mask (not shown in FIG. 1) for forming the trench 12 is removed immediately after trench etch (as is conventional) etching of the buried insulating layer can occur, as illustrated at 26 in FIG. 1. Such etching can lead to defective parts.

Figure 2:
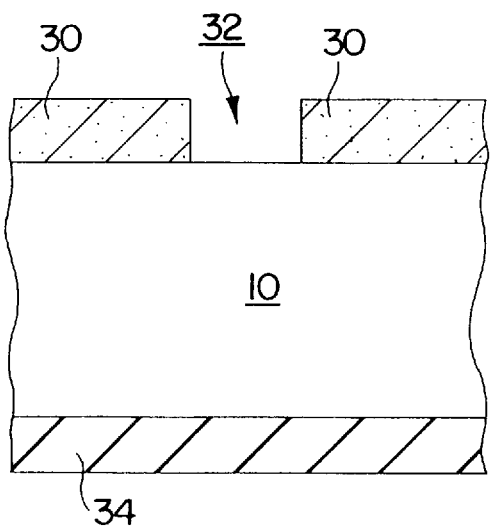
FIG. 2 is a sectional view of a semiconductive substrate with a buried insulator and having an oxide mask with an opening for a trench to be processed in accordance with the present invention.

Referring now to FIG. 2, in carrying out the preferred method of the invention, a layer of silicon dioxide 30 first is deposited on the principal surface of a silicon substrate 10. This layer is patterned, using standard lithography procedures with photo-resist, and etched to define an etch opening 32 for a trench to be formed in the substrate. This etch may for example be carried out with a plasma etch, such as $SF_6$ and $CF_4$ together. The resist is removed at this stage.

Figure 3:
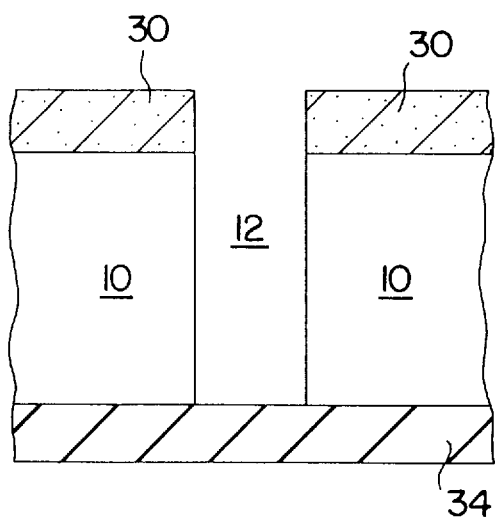
FIG. 3 shows the substrate of FIG. 2 with an etched trench.

A trench 12 then is etched, as shown in FIG. 3, as by means of a reactive ion etch (RIE), for example, HBr. The trench etch stops at the upper surface of a buried oxide insulator 34 forming part of the Silicon-On-Insulator substrate.

Figure 4:
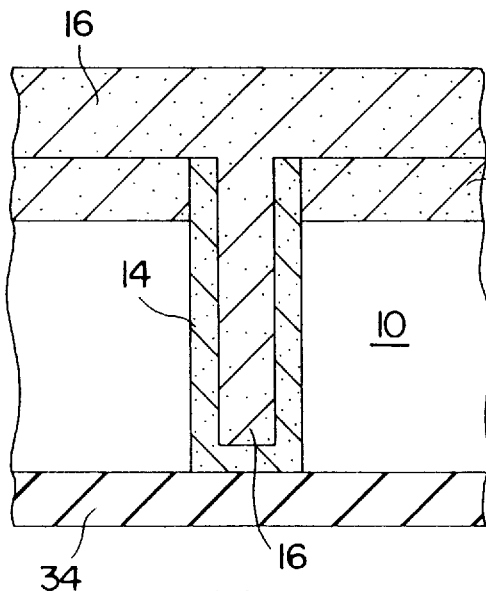
FIG. 4 shows the substrate of FIG. 3 after formation of side wall dielectric layers and filling with deposited polysilicon.

Referring next to FIG. 4, a dielectric 14 then is formed on the side walls of the trench. Preferably, this dielectric is silicon dioxide, thermally grown on the trench side walls. Thereafter, the interior region between the side wall dielectric layers is filled with a thick polysilicon layer 16, in order to completely fill the trench. This polysilicon is applied so as to extend above the trench and out laterally over the adjacent surfaces of the hard mask 30.

Figure 5:
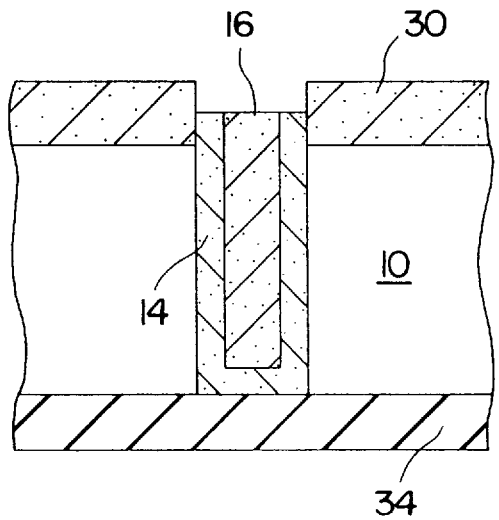
FIG. 5 shows the substrate of FIG. 4 after planarization of the polysilicon.

Next, the polysilicon layer 16 above the hard mask 30 is planarized by etching it away by a blanket etching process. A mixed chemistry plasma etch such as $CF_4$ and $Cl_2$ can be used for this purpose. This etch results in a configuration as shown in FIG. 5, where the upper surface of the polysilicon 16 is below the surface of the hard mask, and just a bit above the adjacent surface of the substrate 10. The mask oxide acts as an etch stop layer, and its thickness is adjusted to provide that the surface of the silicon substrate is protected during planarization.

The surface of the polysilicon inside the trench is higher than the surrounding silicon, thereby to prevent etching of the side wall oxide 14 to a level below the silicon surface during the subsequent mask strip step. By suitable choice of the height "h" of the polysilicon above the silicon surface, an essentially planar surface can be obtained after developing the field oxide, as by LOCOS oxidation.

Figure 6:
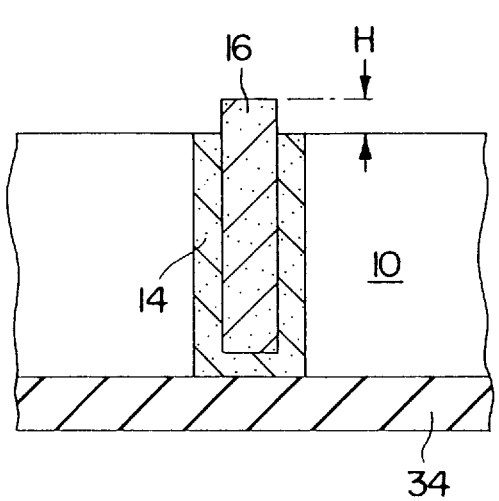
FIG. 6 shows the substrate of FIG. 5 after stripping of the hard mask.
Figure 7:
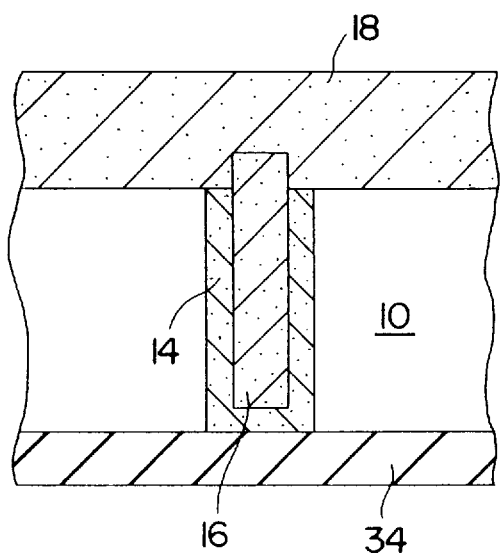
FIG. 7 shows the substrate of FIG. 6 with thermally grown field oxide.

The hard mask 30 is stripped by etching, resulting in the configuration shown in FIG. 6. This can be effected by a wet etch such as HF. By carrying out the mask strip at this stage, etching of the buried oxide layer 34 is avoided.

The next step is to subject the trench isolation region to an oxidation to form the field oxide region 18. The upper surface of the field oxide as finally developed is essentially planar notwithstanding that the polysilicon is higher than the silicon surface. This planar field oxide surface is achievable because the rate of oxidation of the polysilicon is lower than that of the surrounding silicon surface. Thus, by proper selection of the height "h" (FIG. 6), the end result will be a generally flat field oxide surface.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. A method for isolating portions of a semiconductor substrate of the type including a buried insulator extending along the lower surface of said substrate, said substrate having an upper principal surface with said substrate disposed between said principal surface and said buried insulator, and wherein the isolation is effected by forming a trench extending down from said principal surface to be filled with electrically insulating material, said method comprising the steps of:

forming a hard mask layer on said principal surface with an opening outlining a region where said trench is to be formed in said substrate;

etching said substrate through said mask opening using the hard mask layer as an etching mask to develop said trench in a substrate region above said buried insulator;

said etching of said substrate being carried out to such an extent that the bottom of the trench just reaches the upper surface of said buried insulating layer;

applying a layer of dielectric material to the side walls of said trench;

filling the remaining portion of said trench with additional dielectric material which extends above the level of said trench and along the upper surfaces of said mask layer in regions of said mask layer which extend alongside said trench;

planarizing said dielectric material by etching to remove the portions of said dielectric material from above the upper surface of said mask layer in the regions which extend alongside said trench with the upper surface of the dielectric material remaining in said trench being above said principal surface;

after said planarizing step, stripping said mask layer from said principal surface; and thereafter forming a field oxide over both the dielectric material in said trench and the adjacent regions of said principal surface, said upper surface of said dielectric material remaining above said principal surface after formation of said field oxide.

2. The method of claim 1, wherein the layer of insulating material is applied to the side walls of said trench is silicon dioxide and said additional dielectric material is polysilicon.

* * * * *